(12) United States Patent
Dunham et al.

(10) Patent No.: US 6,559,543 B1
(45) Date of Patent: May 6, 2003

(54) STACKED FILL STRUCTURES FOR SUPPORT OF DIELECTRIC LAYERS

(75) Inventors: Timothy G. Dunham, South Burlington, VT (US); Howard S. Landis, Underhill, VT (US); William T. Motsiff, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/991,769

(22) Filed: Nov. 16, 2001

(51) Int. Cl.[7] .................. H01L 23/48; H01L 23/52; H01L 29/40
(52) U.S. Cl. ....................... 257/758; 438/622
(58) Field of Search .................. 257/756, 758–760, 257/750–751; 438/622

(56) References Cited

U.S. PATENT DOCUMENTS

| | | | |
|---|---|---|---|
| 5,278,105 A | | 1/1994 | Eden et al. |
| 5,869,880 A | | 2/1999 | Grill et al. |
| 5,886,410 A | * | 3/1999 | Chiang et al. ............... 257/759 |
| 6,037,664 A | * | 3/2000 | Zhao et al. .................. 257/751 |
| 6,072,690 A | | 6/2000 | Farooq et al. |
| 6,333,558 B1 | * | 12/2001 | Hasegawa .................... 257/759 |
| 2001/0042922 A1 | * | 11/2001 | Mikagi ........................ 257/760 |
| 2001/0044201 A1 | * | 11/2001 | Kudo et al. ................. 438/622 |
| 2001/0054765 A1 | * | 12/2001 | Ohto et al. .................. 257/751 |

* cited by examiner

*Primary Examiner*—Phat X. Cao
*Assistant Examiner*—Thao X. Le
(74) *Attorney, Agent, or Firm*—Schmeiser, Olsen & Watts; Mark F. Chadurjian

(57) ABSTRACT

Disclosed is a semiconductor device comprising: a multiplicity of wiring levels, each wiring level comprising conductive wires and a multiplicity of conductive fill shapes embedded in a dielectric; at least some of the fill shapes in at least two adjacent wiring levels being co-aligned; and where the fill shapes on adjacent levels are aligned, one or more conductive vias extending between and joining each co-aligned fill shape in each adjacent wiring level. The joined fill shapes serve to reinforce and support the dielectric, which may be a non-rigid or low-k dielectric.

10 Claims, 11 Drawing Sheets

STACKED FILL STRUCTURES FOR SUPPORT OF DIELECTRIC LAYERS

FIELD OF THE INVENTION

The present invention relates to the field of semiconductor device design and fabrication; more specifically, it relates to a structure for structural reinforcement and support of interlevel dielectric layers and the method of fabricating said structure.

BACKGROUND OF THE INVENTION

The interconnect structure of semiconductor devices comprise layers (wiring levels) containing conductive wires separated by interlevel dielectric layers (levels.) The conductive wires are electrically isolated from one another by the dielectric layers. The conductive wires in each wiring level are interconnected by conductive vias extending from the conductive wires in one wiring level, through the interlevel dielectric layer, to the conductive wires in a second wiring level. In modern semiconductor devices, the conductive wires are partially embedded in or damascened into the dielectric layers.

As the speed of modern semiconductor devices has increased, interlevel-wiring capacitance has become a problem. Methods were sought to reduce interlevel wiring capacitance. One solution that is becoming popular is the use of low-k dielectric materials such as SILK™ (a polyarylene ether manufactured by Dow Chemical, Midland, Mich.), spin on glass, polyimide or other polymers. These have replaced traditional dielectric materials such a silicon oxide and silicon nitride.

A problem with low-k dielectric materials is they are not rigid like the traditional dielectric materials. Low-k materials are soft, compressible and flexible, have a low modulus and poor interfacial strength, i.e., they tend to delaminate or collapse under mechanical and thermal stress resulting in low yield, poor reliability and higher costs. Some low-k materials are brittle and tend to crack under mechanical or thermal stress. There use in semiconductor devices present two problems. First, because the conductive wires are comprised of metals (such as copper and tungsten) there is a mismatch in thermal expansion between low-k dielectrics and the metal which can lead to delamination, cracking or collapse of the low-k material during manufacture or in use in the field. Second, since the wires are formed by damascene process, which process includes a chemical-mechanical-polish (CMP) step, mechanical stress is induced into the device during CMP, which can lead to delamination, cracking or collapse.

Since low-k dielectric materials, damascene wiring levels, and CMP are basic to the fabrication of high performance semiconductor devices, a method for reducing or eliminating stress induced delamination, cracking or collapse of low-k dielectric layers is highly desirable.

SUMMARY OF THE INVENTION

A first aspect of the present invention is a semiconductor device comprising: a first wiring level having a first conductive fill shape embedded in a first dielectric; a second wiring level having a second conductive fill shape embedded in a second dielectric; and a conductive via extending between and joining the first and second conductive fill shapes.

A second aspect of the present invention is a semiconductor device comprising: a multiplicity of wiring levels, each wiring level comprising conductive wires and a multiplicity of conductive fill shapes embedded in a dielectric; at least some of the fill shapes in at least two adjacent wiring levels being co-aligned; and where the fill shapes on adjacent levels are aligned, one or more conductive vias extending between and joining each co-aligned fill shape in each adjacent wiring level.

A third aspect of the present invention is a semiconductor device comprising: a first wiring level, the first wiring level comprising a conductive wires and a multiplicity of conductive fill shapes embedded in a first dielectric material; a multiplicity of higher wiring levels, each higher wiring level comprising conductive wires and a multiplicity of conductive fill shapes embedded in a second dielectric material; at least some of the fill shapes in one or more pairs of adjacent wiring levels being co-aligned; and where the fill shapes on adjacent levels are aligned, one or more conductive vias extending between and joining each co-aligned fill shape in each pair of adjacent wiring levels.

A fourth aspect of the present invention is a semiconductor device comprising: a first wiring level having a first conductive fill shape having corners, embedded in a first dielectric; a second wiring level having a second conductive fill shape having corners, embedded in a second dielectric, the second conductive fill shape co-aligned with the first fill shape; and a conductive via aligned with each corner of the first and second fill shapes and extending between and joining the first and second conductive fill shapes.

A fifth aspect of the present invention is a semiconductor device comprising: a first wiring level having a first conductive fill shape having corners, embedded in a first dielectric; a second wiring level having a second conductive fill shape having corners, embedded in a second dielectric, the second conductive fill shape co-aligned with the first fill shape; and at least two conductive vias each aligned with a corner of the first and second fill shapes and extending between and joining the first and second conductive fill shapes.

A sixth aspect of the present invention is a method of fabricating a semiconductor device, comprising: providing a substrate; forming on the substrate, a multiplicity of wiring levels, each wiring level comprising conductive wires and a multiplicity of conductive fill shapes embedded in a dielectric; at least some of the fill shapes in at least two adjacent wiring levels being co-aligned; and where the fill shapes on adjacent levels are aligned, forming one or more conductive vias extending between and joining each co-aligned fill shape in each adjacent wiring level.

A seventh aspect of the present invention is a method of fabricating a semiconductor device, comprising: providing a substrate; forming a first wiring level on the substrate, the first wiring level comprising a conductive wires and a multiplicity of conductive fill shapes embedded in a first dielectric material; forming a multiplicity of higher wiring levels on the first wiring level, each higher wiring level comprising conductive wires and a multiplicity of conductive fill shapes embedded in a second dielectric material; at least some of the fill shapes in one or more pairs of adjacent wiring levels being co-aligned; and where the fill shapes on adjacent levels are aligned, forming one or more conductive vias extending between and joining each co-aligned fill shape in each pair of adjacent wiring levels.

An eighth aspect of the present invention is a method of designing a semiconductor device having wiring levels containing wires and fill shapes interspersed with interconnecting via levels containing vias, comprising: selecting a pair of adjacent wiring levels; finding pairs of vertically aligned fill shapes in the adjacent wiring levels; and creating and placing, in the interconnecting via levels between the adjacent wiring levels, one or more vias to interconnect the pairs of fill shapes.

A ninth aspect of the present invention is A method of designing a semiconductor device having wiring levels interspersed with interconnecting via levels, comprising: placing fill shapes at least some of the wiring levels; selecting a pair of adjacent wiring levels; finding pairs of vertically aligned fill shapes in the adjacent wiring levels; and creating and placing, in the interconnecting via levels between the adjacent wiring levels, one or more vias to interconnect the pairs of fill shapes.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1:
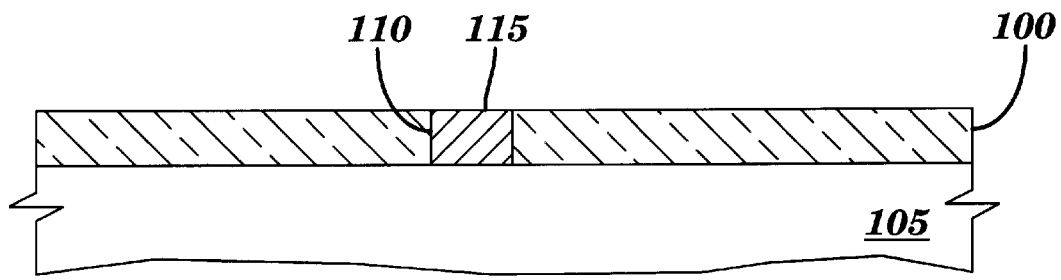
FIGS. 1, 3, 3A, 6, 9 and 12 are partial cross-section views illustrating fabrication of a semiconductor device according to the present invention.

FIG. 1 is a partial cross-section view illustrating the initial structure of the fabrication of a semiconductor device according to the present invention. In FIG. 1, a first dielectric layer 100 is formed on a silicon substrate 105. Formed in trench 110 in first dielectric layer is a conductive contact 115. Silicon substrate 105 may include active devices such as transistors and diodes and inactive devices such as resistors and capacitors. First dielectric layer is preferably, but not necessarily, a rigid (high modulus) dielectric layer. Examples of rigid dielectrics include silicon oxide, silicon nitride, diamond or fluorine doped silicon or combinations of layers thereof. It is preferred that first dielectric layer 100 be a rigid dielectric in order to anchor firmly to silicon substrate 105 the subsequent stack of vias and fill shapes that will be fabricated according to the present invention. Fill shapes are added to wiring levels in order to increase the uniformity of CMP processes. The present invention utilizes pre-existing fill shapes added to the design for CMP purposes, joined by vias, to tie dielectric layers together. If first dielectric layer is, a non-rigid dielectric (low modulus) or low-k dielectric (k<3.5) the present invention will still provide the benefit of tying dielectric layers together. Examples of non-rigid dielectrics or low-k dielectric include spin on glass, porous silicon oxide, polyimide, polyimide siloxane, polysilsequioxane polymer, benzocyclobutene, paralyene N, paralyene F, polyolefin, poly-naphthalene, amorphous Teflon, SILK™ (Dow Chemical, Midland, Mich.), black diamond (Applied Materials, Santa Clara, Calif.), polymer foam or aerogel or layers thereof.

In the present example, conductive contact 110 is formed by a single damascene process. A single damascene process will now be defined. In a single damascene process, first a trench is formed in a dielectric layer, for example by reactive ion etching (RIE). Next, an optional conductive conformal liner is deposited coating the top surface of the dielectric and the sidewalls and bottom of the trench. Then a core conductor is deposited to completely fill the trench as well as coating the top surface of the dielectric layer. Finally, a CMP process performed to remove all conductive material from the top surface of the dielectric layer and polish the top of surface of the conductor filled trench even with the top surface of the dielectric layer.

In one example, conductive contact 115 comprises tungsten, aluminum, aluminum-copper, aluminum-copper-silicon or copper and may include a liner formed on the sidewalls and bottom of trench 110. The liner may be formed from tantalum, tantalum nitride, titanium, titanium nitride, a titanium-tungsten alloy or layers thereof.

Figure 2:
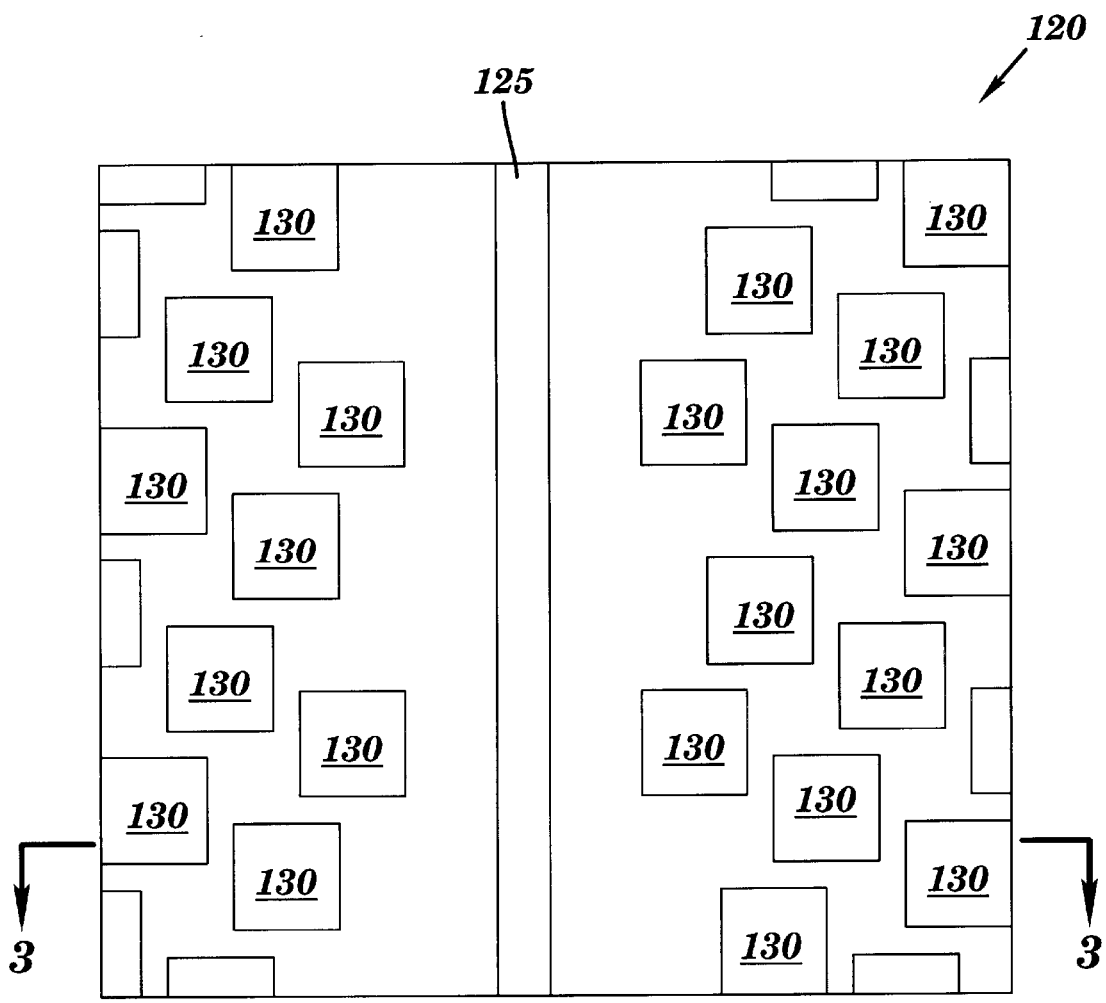
FIGS. 2, 4, 5, 7, 8 10 and 11 are partial top views of wiring and via photomasks used in the fabrication of the semiconductor device according to the present invention.

FIG. 2 is a partial top view of a first wiring level photomask used in the fabrication of the semiconductor device according to the present invention. In FIG. 2, first wiring level photomask 120 includes a first wire feature 125 and a plurality of first fill shape features 130. First wiring level photomask 120 is used to fabricate a first wiring level as illustrated in FIG. 3 and described below.

Fill Shapes

Figure 3:
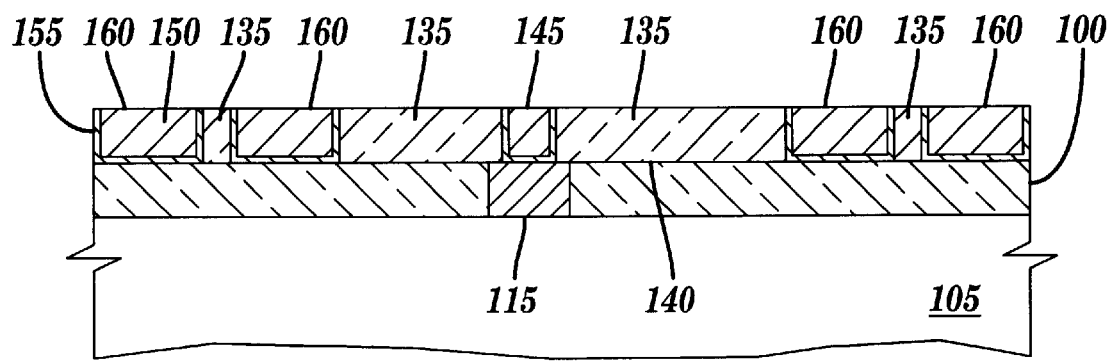

FIG. 3 is a partial cross-section view through 3—3 of FIG. 2 illustrating a first step in the fabrication of a semiconductor device according to the present invention. In FIG. 3, a second dielectric layer 135 is formed on a top surface 140 of first dielectric layer 100. A first conductive wire 145 (corresponding to first wire feature 125 of mask of first photomask 120) comprising a core conductor 150 and an optional liner 155 is formed in second dielectric layer 135. Also formed in second dielectric layer 135 is a plurality of first fill shapes 160 (corresponding to first fill shape features 130 of first wiring level photomask 120.) A single damascene process is used to form first conductive wire 145 and first fill shapes 160. Each fill shape 160 is formed from core conductor 150 and optional liner 155. First conductive wire 145, and first fill shapes 160 are formed in second dielectric 135 using photomask 120 and a single damascene process. Fill shapes 160 are in contact with top surface 140 of first dielectric layer 100. First conductive wire is electrical contact with conductive contact 115. Liner 155, among other purposes, by selection of material combinations, serves to improve adhesion of core conductor 150 to first dielectric layer 100.

Second dielectric layer 135 is preferably a non-rigid dielectric layer (or a dielectric with a coefficient of expansion greater than the metal used for wiring). In one example, second dielectric layer 135 is spin on glass, porous silicon oxide, polyimide, polyimide siloxane, polysilsequioxane polymer, benzocyclobutene, paralyene N, paralyene F, polyolefin, poly-naphthalene, amorphous Teflon, SILK™ (Dow Chemical, Midland, Mich.), black diamond (Applied Materials, Santa Clara, Calif.), polymer foam or aerogel or layers thereof. While rigid dielectrics may not benefit as greatly from the present invention, second dielectric layer 135 may be a rigid dielectric. In a second example, second dielectric layer 135 is silicon oxide, silicon nitride, diamond or fluorine doped silicon or combinations of layers thereof. Second dielectric layer 135 may also be formed from a combination of rigid and non-rigid dielectrics, an example of which would be a thin layer of silicon nitride over a thicker layer of SILK™ (Dow Chemical, Midland, Mich.).

In one example, core conductor 150 comprises tungsten, aluminum, aluminum-copper, aluminum-copper-silicon or copper and may include a liner 155 formed on the sidewalls and bottom of trench 110. In one example, liner 155 comprises tantalum, tantalum nitride, titanium, titanium nitride, a titanium-tungsten alloy or layers thereof.

Figure 3A:
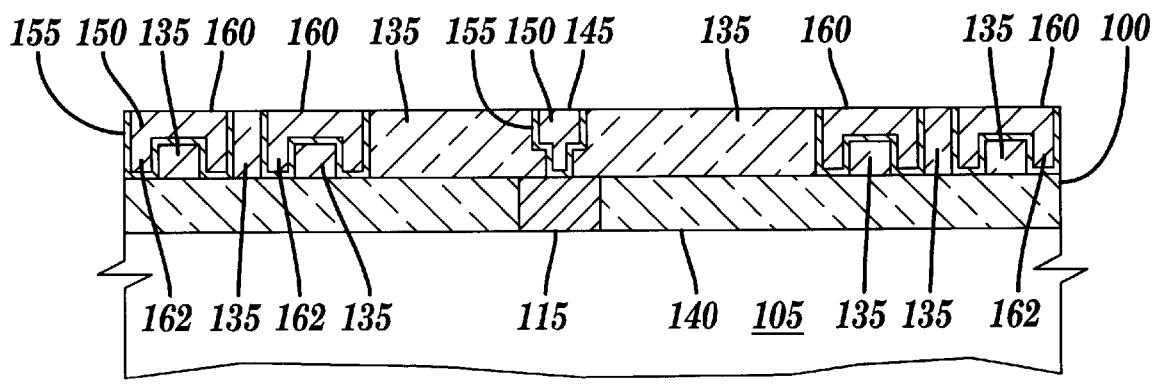

While first conductive wire 145 and first fill shapes 160 have been described as being formed in second dielectric 135 using a single damascene process, a dual damascene process may just as easily be used. However, since fill shapes 160 should be in bonding contact with first dielectric layer 100, the present invention would then require forming vias under each first fill shape 160, the vias in contact with and providing the bonding contact to the first dielectric layer. This is illustrated in FIG. 3A. The significant difference between FIG. 3 and FIG. 3A, is the presence of vias 162 between first fill shapes 160 and top surface 140 of first dielectric layer 100. A dual damascene process will now be defined.

In a dual damascene process, first a trench is formed in a dielectric layer (using a first photomask) for example by RIE. The trench is formed to a depth less than the total thickness of the dielectric layer. This step defines the wires and fill shapes. Then vias are formed in the bottom of the trench (using a second photomask) through to the underlying material, again by RIE. This step defines the interconnections between wiring levels. Next, an optional conductive conformal liner is deposited coating the top surface of the dielectric and the sidewalls and bottom of the trench, via sidewalls and the underlying layer exposed at the bottom of the vias. Then a core conductor is deposited to completely fill the trench as well as coating the top surface of the dielectric layer. Finally, a CMP process performed to remove all conductive material from the top surface of the dielectric layer and polish the top of surface of the conductor filled trench even with the top surface of the dielectric layer. The vias are integral with the wires and fill shapes in a dual damascene process.

Figure 4:
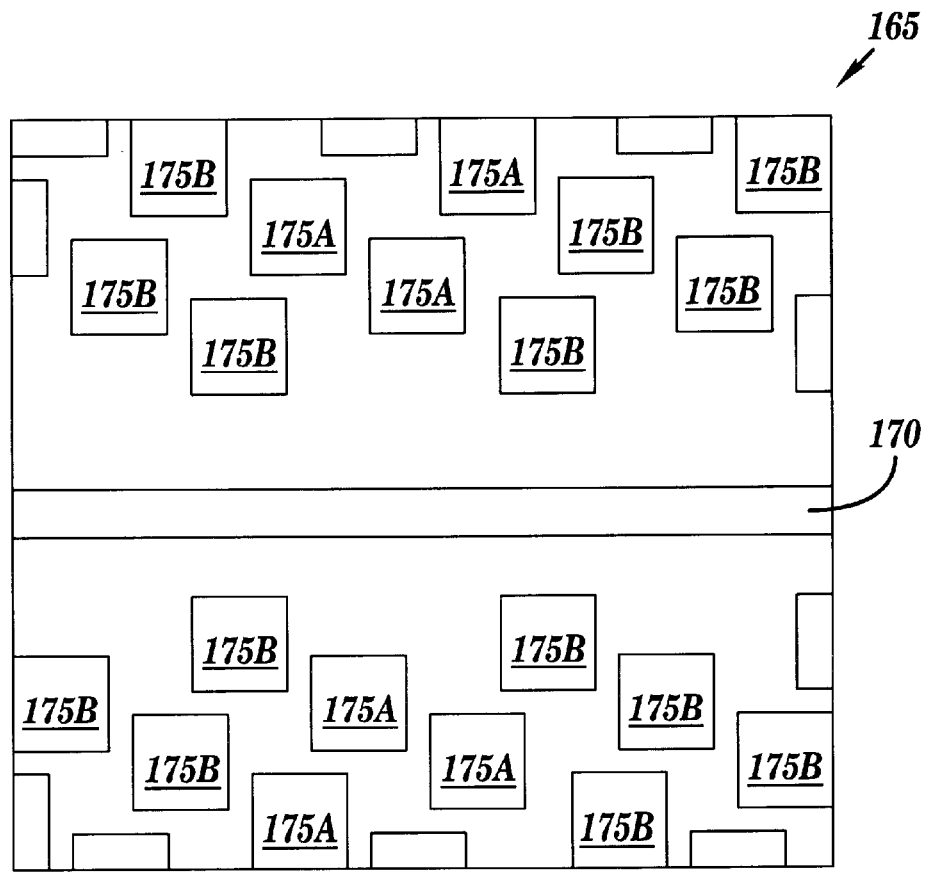
Figure 6:
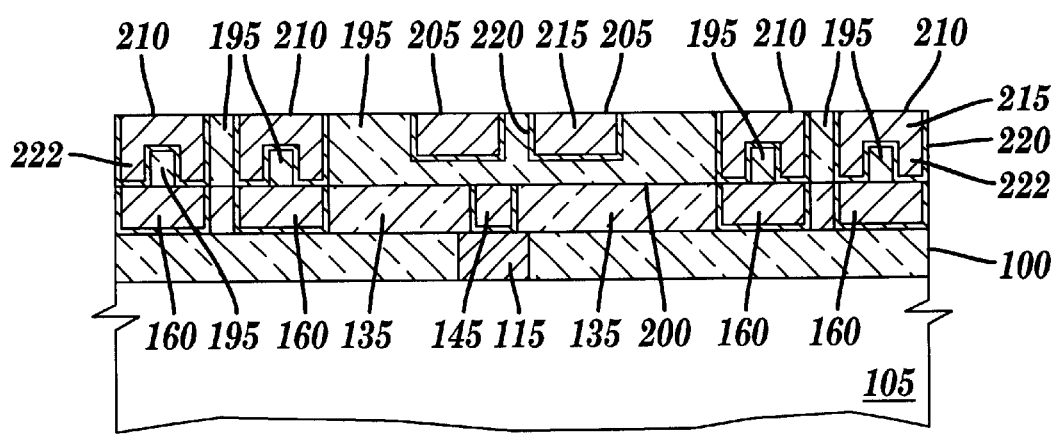
Figure 5:
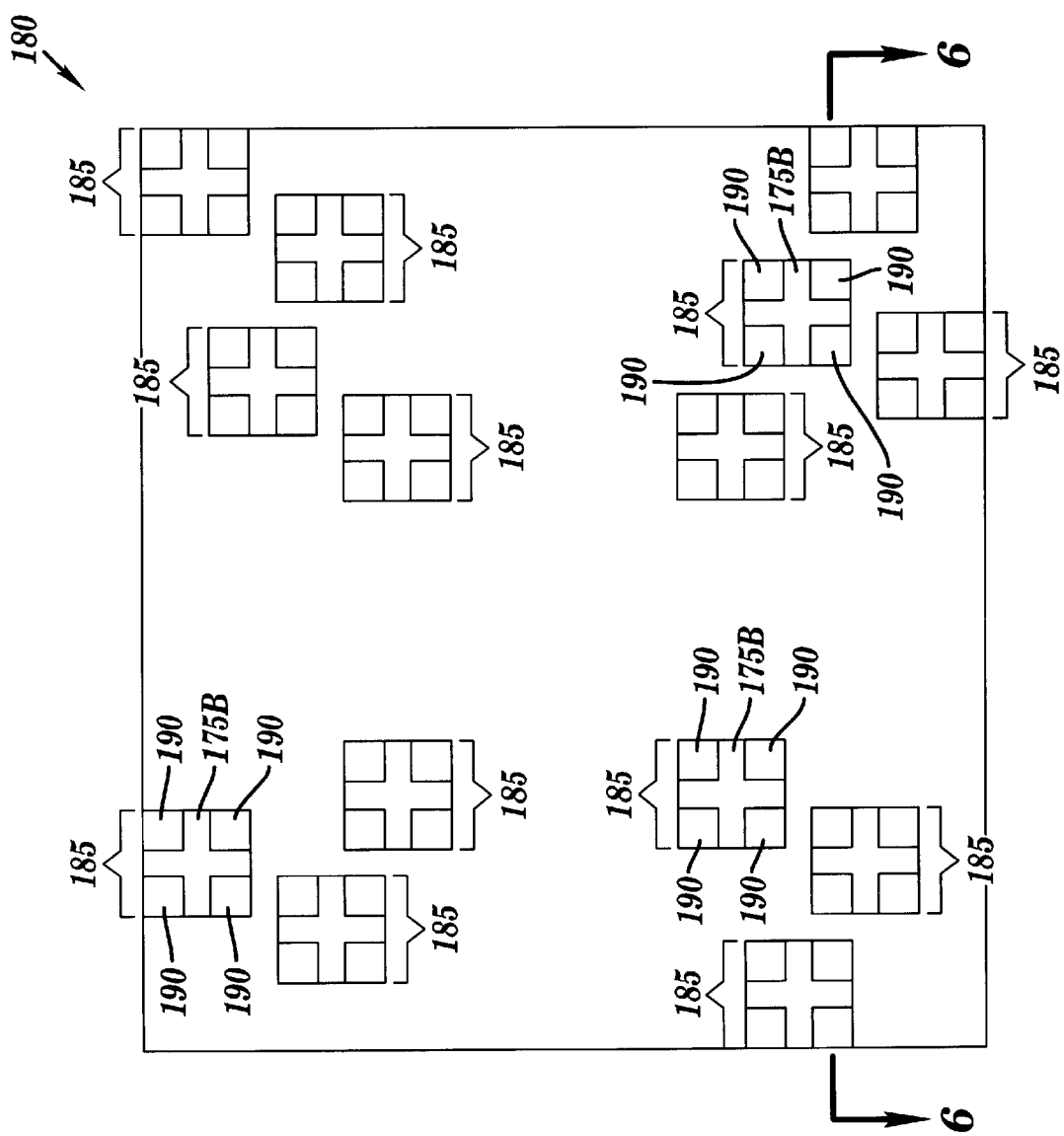

FIG. 4 is a partial top view of a second wiring level photomask used in the fabrication of the semiconductor device according to the present invention. FIG. 4 illustrates the same region of the semiconductor device as illustrated in FIG. 2. In FIG. 4, second wiring level photomask 165 includes a second wire feature 170 and a plurality of second fill shape features 175A and second fill shape features 175B. Second wiring level photomask 165 is used in conjunction with a first via photomask to fabricate a second wiring level as illustrated in FIG. 6 and described below. The first via photomask is illustrated in FIG. 5 and described below. The difference between second fill shape features 175A and second fill shape features 175B is second fill shape features 175B overlay first fill shape features 130 of first wiring level photomask 120 while second fill shape features 175A do not.

FIG. 5 is a partial top view of a first via level photomask used in the fabrication of the semiconductor device according to the present invention. FIG. 5 illustrates the same region of the semiconductor device as illustrated in FIGS. 2 and 4. In FIG. 5, first via level photomask 180 includes a plurality of via feature sets 185. Each via feature set 185 includes one or more individual via features 190. In the present example, four via features 190 are included in each via feature set 185. Second fill shape features 175B are illustrated by dashed lines for clarification of the placement of vias 190. Via features 190 are added to photomask 180 in addition to the normal via features for interconnecting first and second level wires.

FIG. 6 is a partial cross-section view through 6—6 of FIG. 5 illustrating a second step in the fabrication of a semiconductor device according to the present invention. In FIG. 6, a third dielectric layer 195 is formed on a top surface 200 of second dielectric layer 135. Formed in second dielectric layer 195 is a plurality of second fill shapes 205 and second fill shape/via combinations 210 formed by a dual damascene process.

Second fill shapes 205 correspond to second fill shape features 175A of second wiring level mask 165 and second fill shape/via combinations 210 correspond to second fill shape features 175B of second wiring level photomask 165 in combination with via features 190 of first via level photomask 180.

Each second fill shape 205 and second fill shape/via combinations 210 are formed from a core conductor 215 and an optional liner 220. Fill shapes 205 are embedded in second dielectric layer 195. Second fill shape/via combinations 210 are in bonding (and electrical) contact with first fill shapes 160. Materials for third dielectric layer 195 are the same as listed above for second dielectric layer 135. Materials for core conductor 215 are the same as listed above for core conductor 150. Materials for liner 220 are the same as listed above for liner 155.

Second fill shape/via combinations 210 are contact bonded to first dielectric layer 100 through first fill shapes 160. Third dielectric layer 195 is locked between first fill shapes 160 and second fill shapes 175B by vias 222. This locking of third dielectric layer 195 imparts additional mechanical strength and rigidity to the third dielectric layer. The locking of third dielectric layer 195 also and reduces the effect of any thermal expansion mismatch between the third dielectric layer and metal features such as wires and fill shapes. Further, third dielectric layer 195 is in effect spot fastened to second dielectric layer 135, reducing the tendency to delamination of the two dielectric layers under thermal or mechanical stress.

Figure 7:
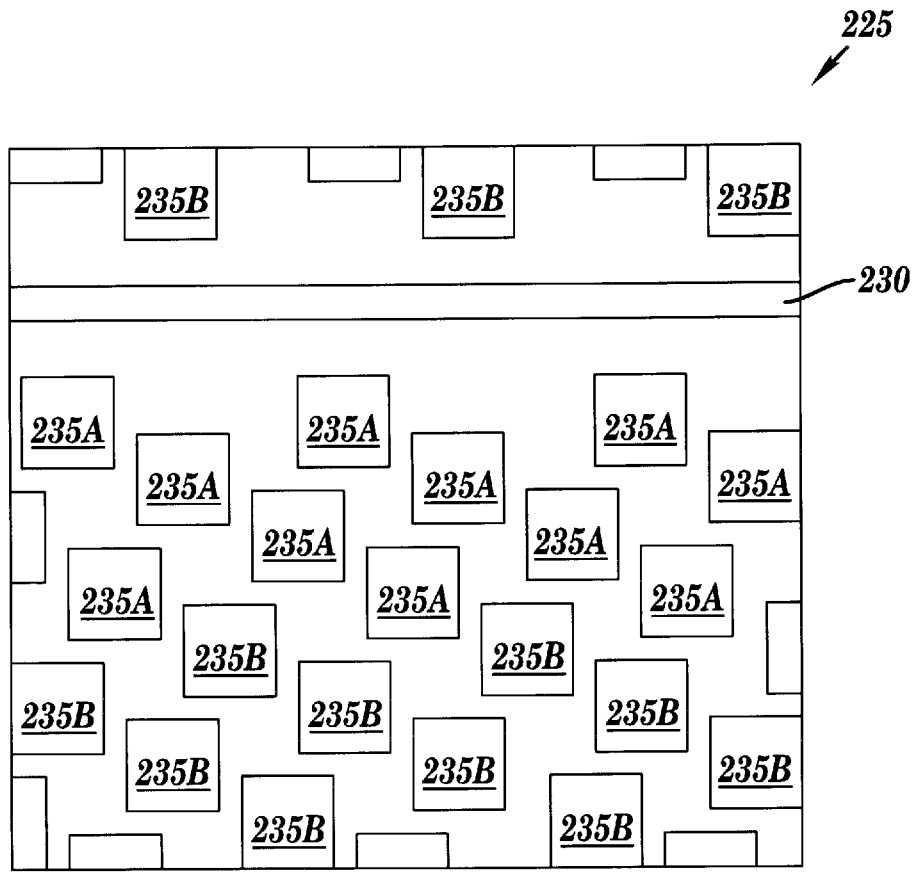
Figure 9:
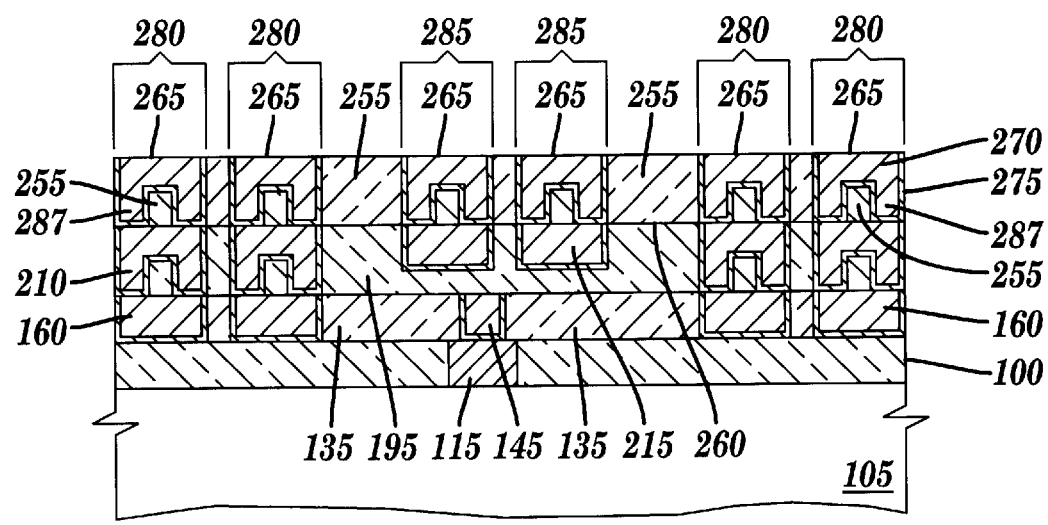
Figure 8:
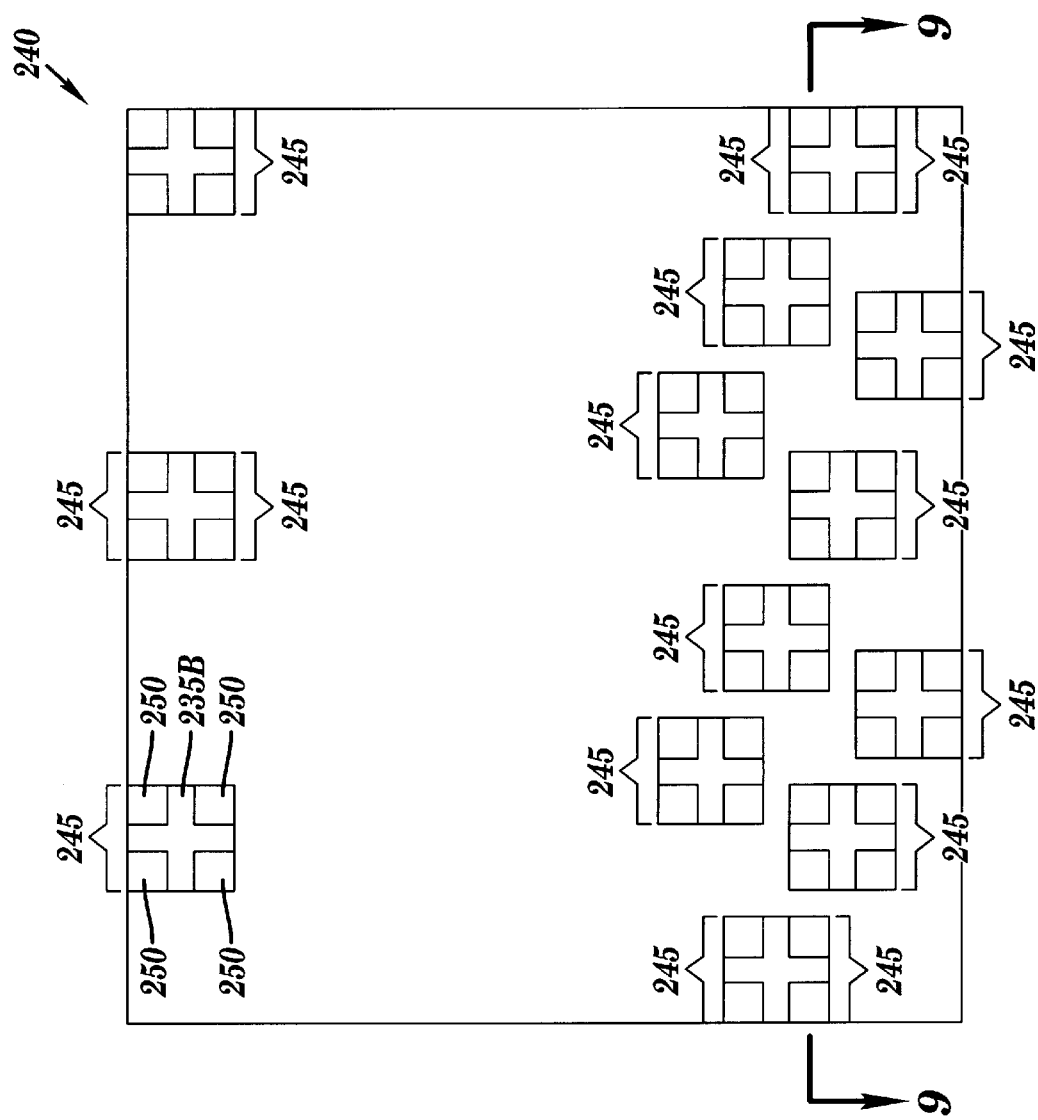

FIG. 7 is a partial top view of a third wiring level photomask used in the fabrication of the semiconductor device according to the present invention. FIG. 7 illustrates the same region of the semiconductor device as illustrated in FIGS. 2, 4 and 5. In FIG. 7, third wiring level photomask 255 includes a third wire feature 230 and a plurality of third fill shape features 235A and third fill shape features 235B. Third wiring level photomask 255 is used in conjunction with a second via photomask to fabricate a third wiring level as illustrated in FIG. 9 and described below. The second via photomask is illustrated in FIG. 8 and described below. The difference between third fill shape features 235A and third fill shape features 235B is third fill shape features 235B overlay second fill shape features 175A or 175B of second wiring level photomask 165 while third fill shape features 235A do not.

FIG. 8 is a partial top view of a second via level photomask used in the fabrication of the semiconductor device according to the present invention. FIG. 8 illustrates the same region of the semiconductor device as illustrated in FIGS. 2, 4, 5 and 7. In FIG. 8, second via level photomask 240 includes a plurality of via feature sets 245. Each via feature set 245 includes one or more individual via features 250. In the present example, four via features 250 are included in each via feature set 245. Third fill shape features 235B are illustrated by dashed lines for clarification of the placement of via features 250. Via features 250 are added to photomask 240 in addition to the normal via features for interconnecting second and third level wires.

FIG. 9 is a partial cross-section view through 9—9 of FIG. 8 illustrating a third step in the fabrication of a semiconductor device according to the present invention. In FIG. 9, a fourth dielectric layer 255 is formed on a top surface 260 of third dielectric layer 195. Formed in third dielectric layer 255 is a plurality of third fill shape/via combinations 265 formed by a dual damascene process.

Third fill shape/via combinations 265 correspond to third fill shape features 235B of third wiring level photomask 225 in combination with via features 250 of second via level photomask 240.

Each third fill shape/via combination 265 is formed from a core conductor 270 and an optional liner 275. Third fill shape/via combinations 265 are in bonding (and electrical) contact with second fill shapes 205 or second fill shape/via combinations 210. Materials for fourth dielectric layer 255 are the same as listed above for second dielectric layer 135. Materials for core conductor 270 are the same as listed above for core conductor 150. Materials for liner 275 are the same as listed above for liner 155.

In first fill shape/via stacks 280, third fill shape/via combinations 265 are contact bonded to first dielectric layer 100 through first fill shapes 160 and second fill shape/via combinations 210. In a second fill shape/via stack 285, third fill shape/via combinations 265 are contact bonded to second fill shapes 205. Fourth dielectric layer 255 is locked between third fill shapes 265 and second fill shapes 175A and 175B by vias 287. This locking of fourth dielectric layer 255 imparts additional mechanical strength and rigidity to the fourth dielectric layer. The locking of fourth dielectric layer 255 also and reduces the effect of any thermal expansion mismatch between the fourth dielectric layer and metal features such as wires and fill shapes. Further, fourth dielectric layer 255 is in effect spot fastened to third dielectric layer 195, reducing the possibility of delamination of the two dielectric layers under stress, either thermal or mechanical.

The fill shape size and pitch has been the same on all the wiring levels so far described. The invention can also be applied between two wiring levels having different fill shape sizes and pitches. This is illustrated in FIGS. 10, 11 and 12 and described below.

Figure 10:
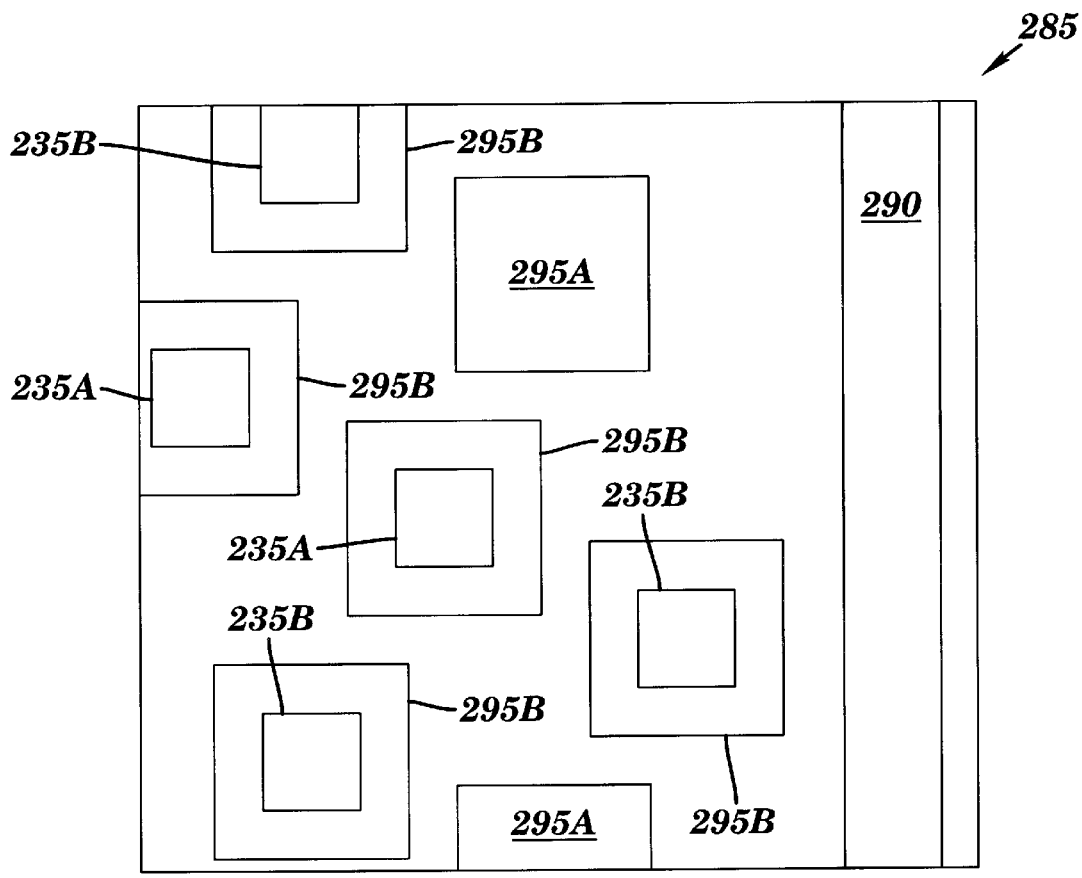

FIG. 10 is a partial top view of a fourth wiring level photomask used in the fabrication of the semiconductor device according to the present invention. FIG. 10 illustrates the same region of the semiconductor device as illustrated in FIGS. 2, 4 and 5, 7 and 8. In FIG. 10, fourth wiring level photomask 285 includes a fourth wire feature 290 and a plurality of fourth fill shape features 295A and fourth fill shape features 295B. Fourth wiring level photomask 285 is used in conjunction with a third via photomask to fabricate a fourth wiring level as illustrated in FIG. 12 and described below. The third via photomask is illustrated in FIG. 11 and described below. The difference between fourth fill shape features 295A and fourth fill shape features 295B is fourth fill shape features 295B overlay third fill shape features 235A or 235B of third wiring level photomask 225 while fourth fill shape features 295A do not.

Figure 11:
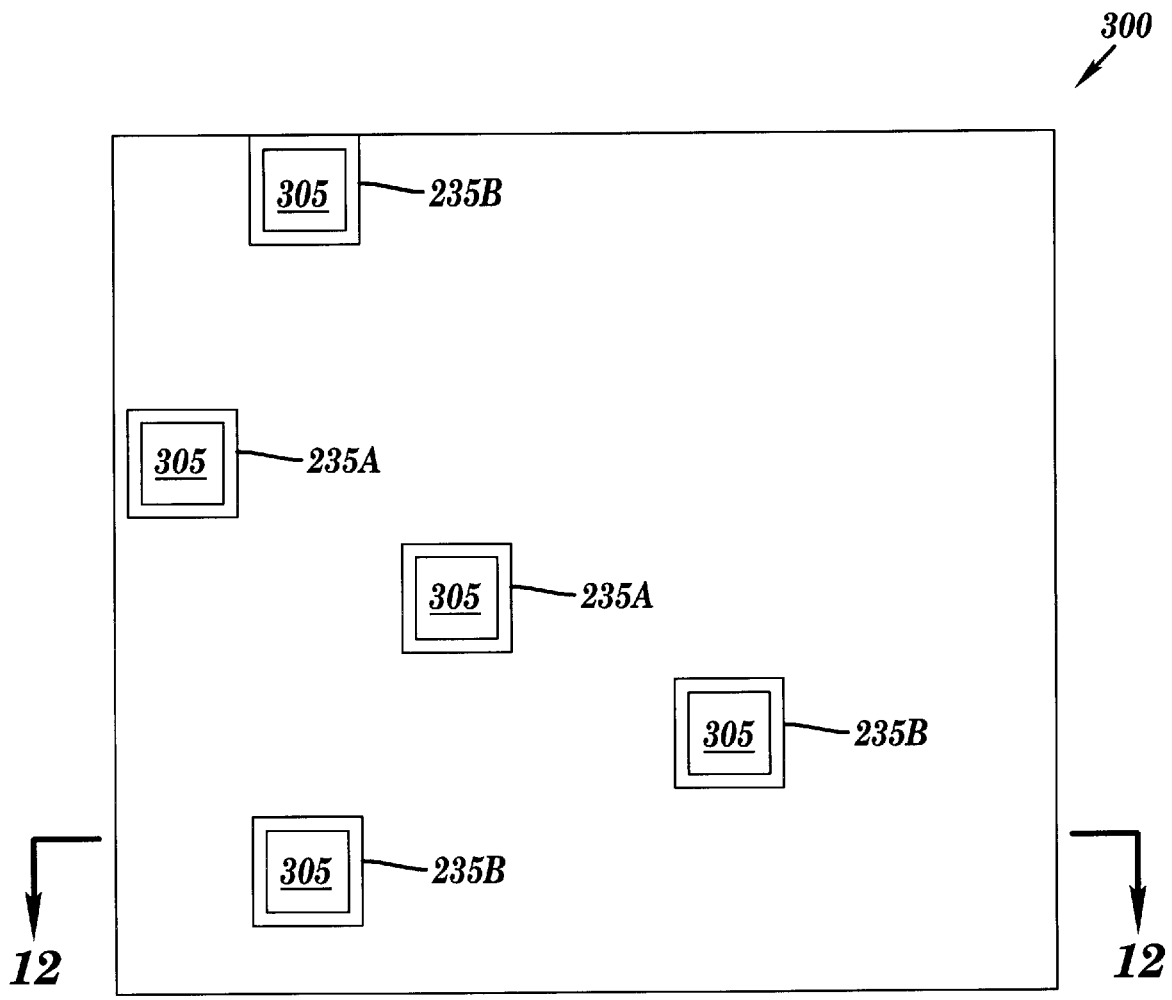

FIG. 11 is a partial top view of a third via level photomask used in the fabrication of the semiconductor device according to the present invention. FIG. 11 illustrates the same region of the semiconductor device as illustrated in FIGS. 2, 4, 5, 7, 8 and 10. In FIG. 11, third via level photomask 300 includes a plurality of via features 305. Third fill shape features 235A and 235B are illustrated by dashed lines for clarification of the placement of via features 305. Via features 305 are added to photomask 300 in addition to the normal via features for interconnecting second and third level wires.

Figure 12:
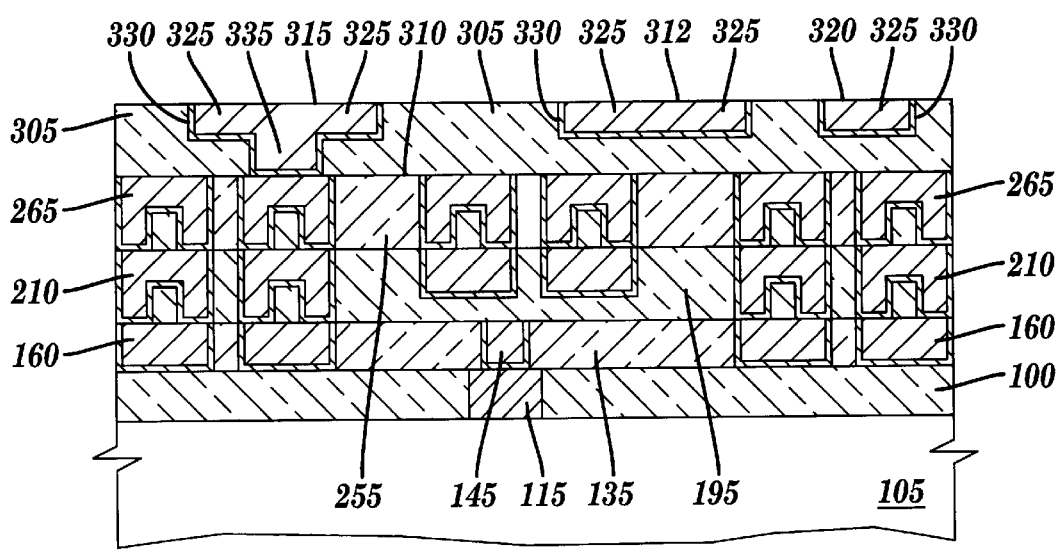

FIG. 12 is a partial cross-section view through 12—12 of FIG. 11, illustrating a fourth step in the fabrication of a semiconductor device according to the present invention. In FIG. 12, a fifth dielectric layer 305 is formed on a top surface 310 of fourth dielectric layer 255. Formed in fourth dielectric layer 305 is plurality of fourth fill shapes (one illustrated) 312, a plurality of fourth fill shape/via combinations 315 (one illustrated) and a fourth conductive wire 320, all formed by a dual damascene process.

Fourth fill shape 310 corresponds to fill shape feature 295A of fourth wiring level photomask 285. Fill shape/via combinations 315 correspond to fourth fill shape features 235B of fourth wiring level photomask 285 in combination with via features 305 of third via level photomask 300.

Each fourth fill shape 310, fourth fill shape/via combinations 315 and fourth conductive wire 320 is formed from a core conductor 325 and an optional liner 330. Fourth fill shape/via combinations 325 are in bonding (and electrical) contact with third fill shapes 235A (not illustrated) or third fill shape/via combinations 235B. Materials for fifth dielectric layer 305 are the same as listed above for second dielectric layer 135. However, if fifth dielectric layer 305 is the uppermost dielectric layer of the semiconductor device, it may be preferable for contamination reasons, that the dielectric layer comprise a rigid dielectric or comprise a lower layer of non-rigid dielectric and an upper layer of rigid dielectric such as a layer of silicon oxide or silicon nitride over SILK™. Materials for core conductor 325 are the same as listed above for core conductor 150. Materials for liner 330 are the same as listed above for liner 155.

In FIG. 12, fourth fill shape/via combination 315 is contact bonded to third fill shape/via combinations 265. Fifth dielectric layer 305 is locked between fourth fill shapes 315 and third fill shapes 265 by via 335. This locking of fifth dielectric layer 305 imparts additional mechanical strength and rigidity to the fifth dielectric layer. The locking of fifth dielectric layer 305 also and reduces the effect of any thermal expansion mismatch between the fifth dielectric layer and metal features such as wires and fill shapes. Further, fifth dielectric layer 305 is in effect spot fastened to fourth dielectric layer 255, reducing the possibility of delamination of the two dielectric layers under stress, either thermal or mechanical.

Figure 13:
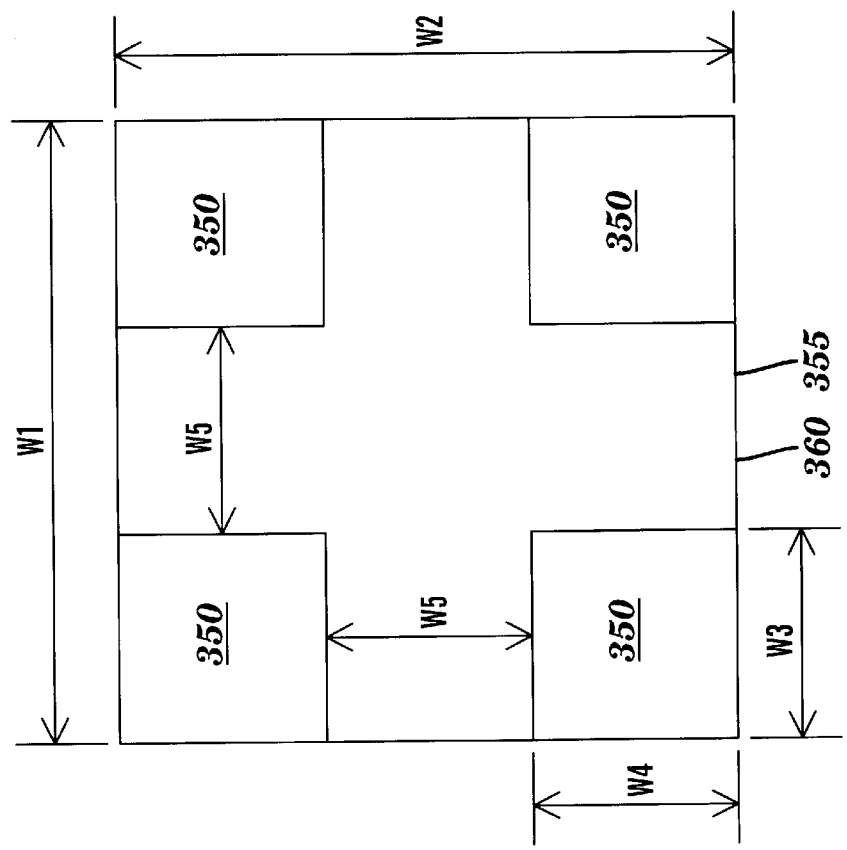

FIGS. 13 through 16 are top view schematic diagrams illustrating alternative placement of via mask features relative to fill shape mask features according to the present invention. In FIG. 13, four via features 350 are placed between co-aligned upper and lower fill shape features 355 and 360 (indicated by dotted lines). Fill shape features 355 and 360 are "W1" wide by "W2" long. Each via feature 350 is "W3" wide by "W4" long and spaced a distance "W5" apart. In one example "W1"="W2" and "W3"="W4"="W5" where "W1" is about 0.05 micron to 2.0 microns.

Figure 14:
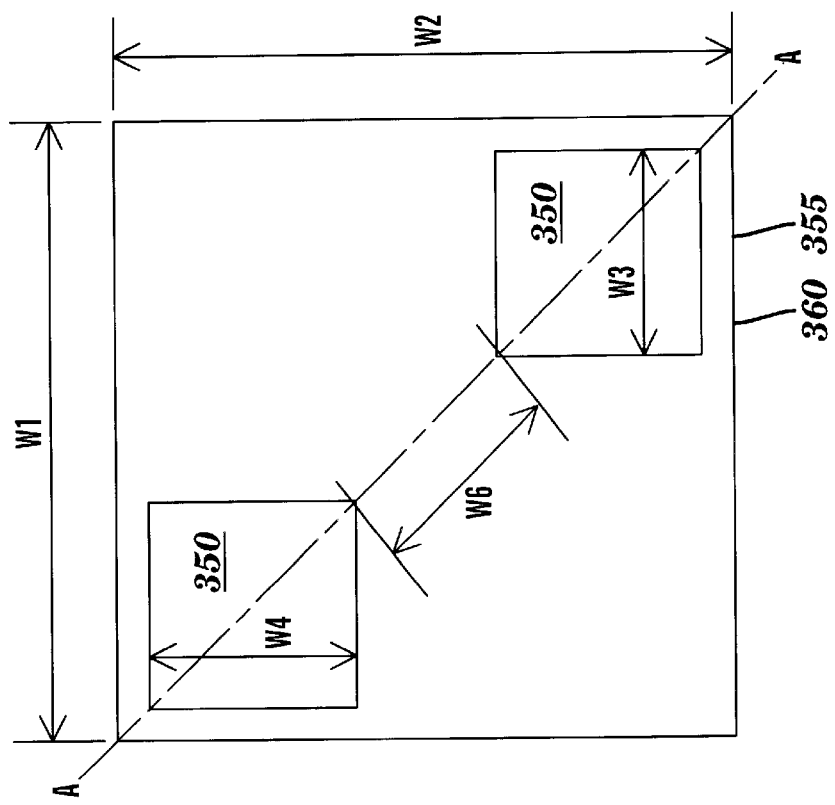
FIGS. 13 through 16 are top view schematic diagrams illustrating alternative placement of via mask features relative to fill shape mask features according to the present invention.

In FIG. 14, two via features 350 are placed between co-aligned upper and lower fill shape features 355 and 360 (indicated by dotted lines). Via features 350 is located in opposite corners of fill shape 355. Fill shape features 355 and 360 are "W1" wide by "W2" long. Each via feature 350 is "W3" wide by "W4" long and spaced a distance "W6" apart along diagonal line A—A. In one example "W1"="W2," "W3"="W4" ="W6" and "W6"="W1"/3 where "W1" is about 0.05 micron to 2.0 microns.

Figure 15:
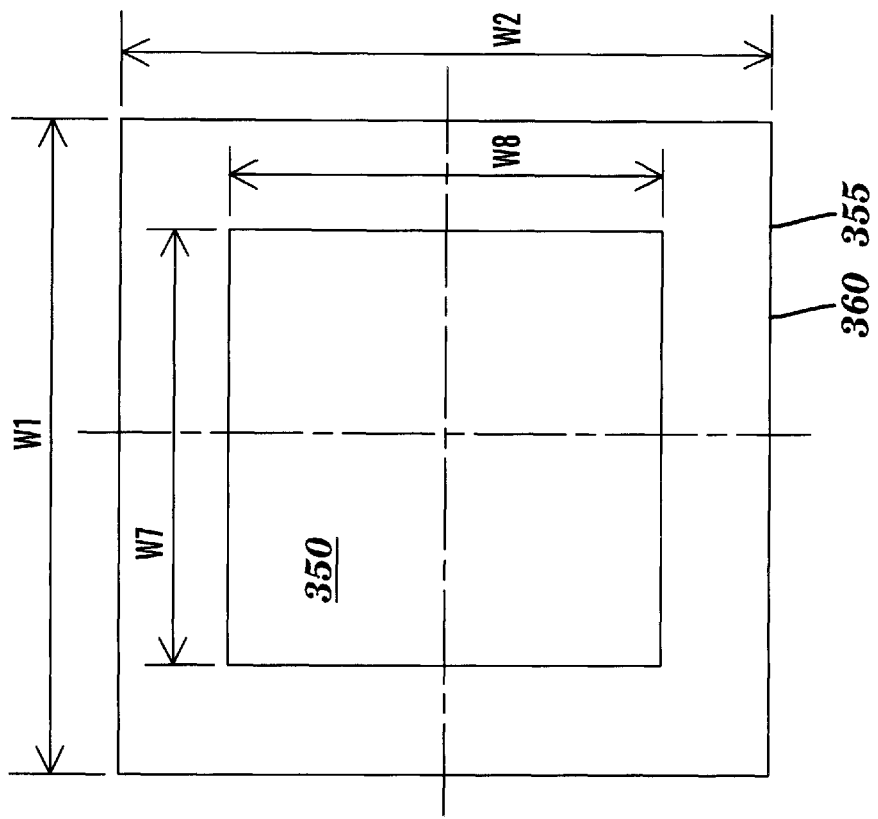

In FIG. 15, a single via feature 350 is placed between co-aligned upper and lower fill shape features 355 and 360 (indicated by dotted lines). Fill shape features 355 and 360 are "W1" wide by "W2" long. Via feature 350 is "W7" wide by "W8" long and approximately centered on fill shape features 355 and 360. In one example "W1"="W2","W7"= "W8" and "W6"="W1"/3 where "W1" is about 0.05 micron to 2.0 microns and "W7" is about 0.05 micron to 2.0 but not larger than "W1."

Figure 16:
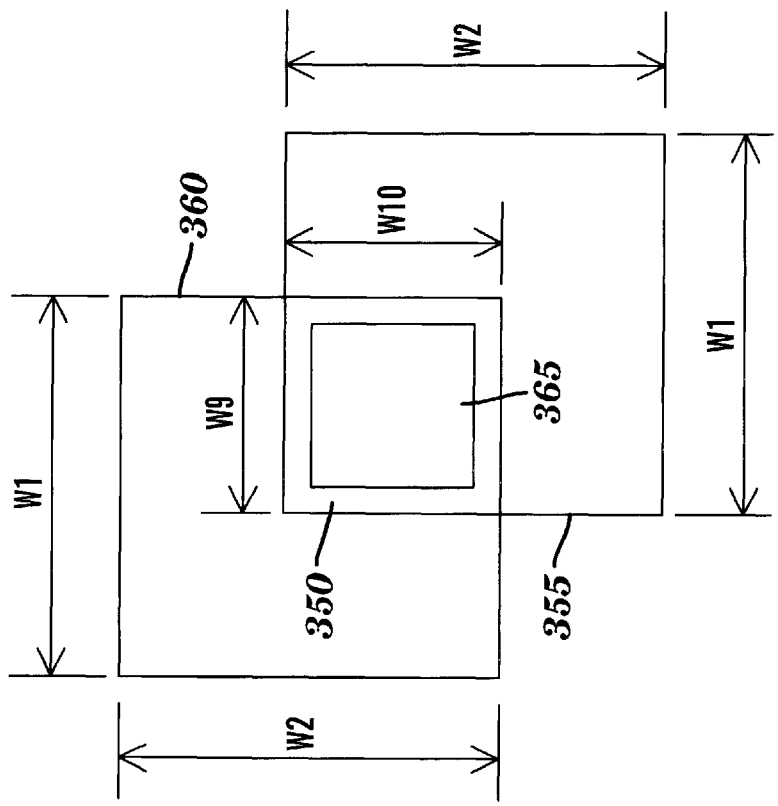

In FIG. 16, a single via feature 350 is placed between offset upper fill shape feature 360 and lower fill shape feature 355 (indicated by dotted lines). Fill shape features 355 and 360 are "W1" wide by "W2" long and overlap by distances "W9" and "W10." In a first example, via feature 350 is "W9" wide by "W10" long and corresponds in size to the overlap of upper fill shape feature 360 with lower fill level feature 355. "W1"="W2","W9"="W10" where "W1" is about 0.05 micron to 2.0 microns and "W9" is about 0.05 micron to 2.0 but not larger than "W1." In a second example, a via feature 350A is "W11" wide by "W12" long where "W11"<"W10" and "W12"<"W10."

Figure 17:
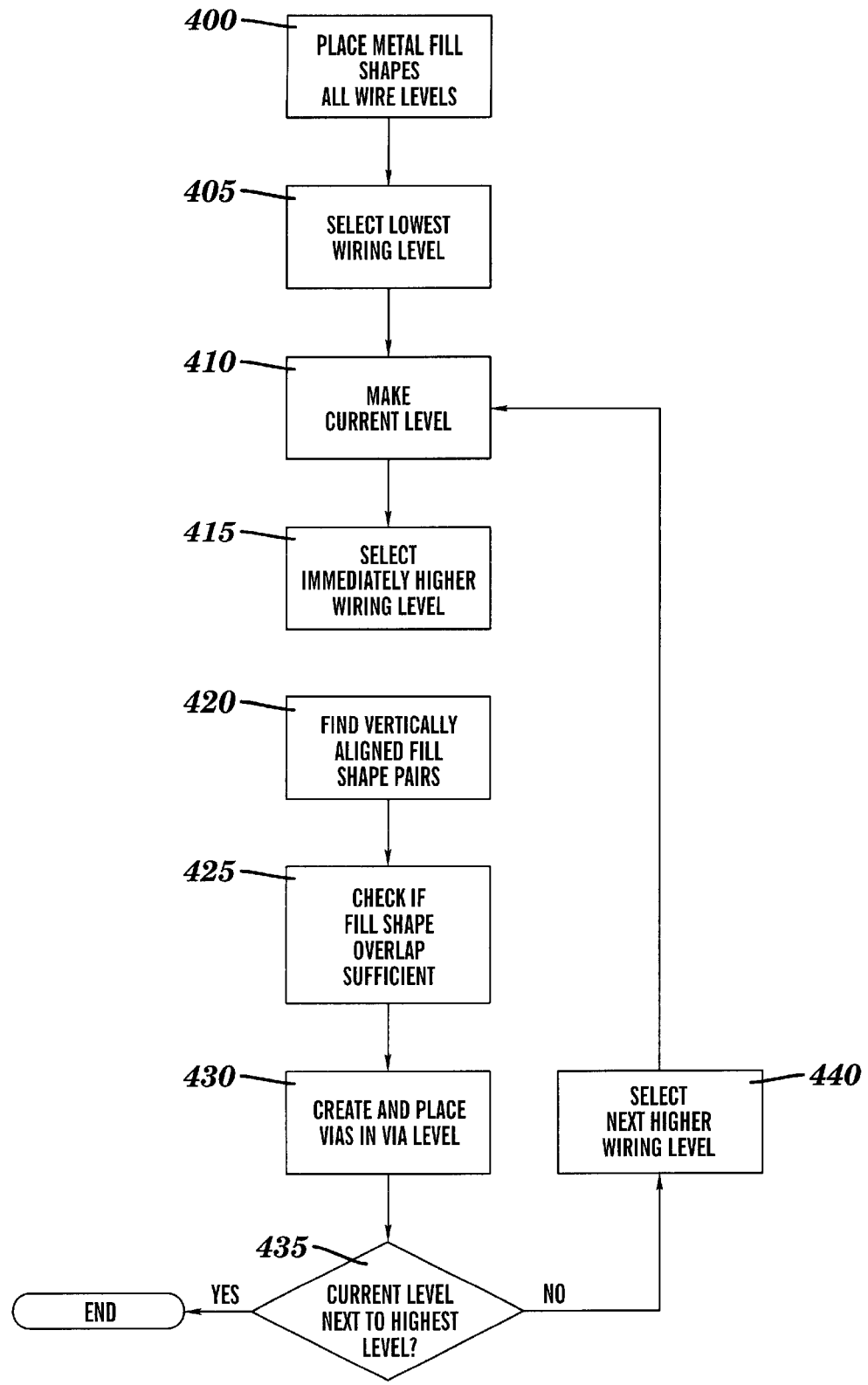
FIG. 17 is a flowchart illustrating the method of adding fill shape interconnecting vias to via masks according to the present invention.

FIG. 17 is a flowchart illustrating the method of adding fill shape interconnecting vias to via masks according to the present invention. In step 400, fill shapes are placed on all wiring levels of the device design. These are normal fill shapes, added to each metal level to compensate for CMP process attributes such as uneven polishing that occur when fill shapes are not used. In step 405, the lowest wiring level is selected. The first wiring level is defined as the lowest wiring level. In step 410, the selected wiring level is made the current wiring level. In step 415, the wiring level immediately above the current level is selected. If the current wiring level is the first wiring level, then the second wiring level is selected. If the current wiring level is the second, then the third wiring level is selected. In step 420, vertically aligned fill shape pairs are found. A fill shape pair consists of one fill shape form the current wiring level and one fill shape from the next immediately higher wiring level. In step 425, a check for sufficient overlap between each fill shape pair is made. Vertical alignment may range from exact overlap (see FIGS. 13, 14 and 15) to a partial overlap (see FIG. 16) of the upper and lower fill shapes. In the case of a partial overlap, the overlap must be of at least a minimum predetermined amount. The amount of overlap must be sufficient to place one or more vias of a predetermined size and layout geometry into the via level design of the via level between two selected wiring levels containing the upper and lower fill shapes. In step 430, vias are created and placed in the via level between the two selected wiring levels. These vias are in addition to the normal vias already existing in the via levels design and used to interconnect wires from adjacent wiring levels. In step 435, it is determined if the current wiring level is the next to highest wiring level. If the current wiring level is the next to highest wiring level, the method terminates. If the current wiring level is not the next to highest wiring level, then in step 440, the next higher (relative to the current wiring level) wiring level is selected and the method loops back to step 410.

The description of the embodiments of the present invention is given above for the understanding of the present invention. It will be understood that the invention is not to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A semiconductor device comprising:

a first wiring level having a first conductive fill shape, said first fill shape having corners, said first fill shape embedded in a first dielectric;

a second wiring level having a second conductive fill shape, said second fill shape having corners, said second fill shape embedded in a second dielectric, said second fill shape co-aligned with said first fill shape; and each conductive via of a set of vias aligned with a single and different corner of said first fill shape and a corresponding corner of said second fill shape and extending between and joining said first and second fill shapes.

2. The semiconductor device of claim 1, wherein said first and second dielectrics are low-k dielectrics.

3. The semiconductor device of claim 1, wherein:

said first dielectric comprises a rigid dielectric; and said second dielectric comprises a low-k or non-rigid dielectric.

4. The semiconductor device of claim 1, wherein said first and second dielectrics are selected from the group consisting of spin on glass, porous silicon oxide, polyimide, polyimide siloxane, polysilsequioxane polymer, benzocyclobutene, paralyene N, paralyene F, polyolefin, poly-naphthalene, amorphous Teflon, SILK™, black diamond, polymer foam or aerogel and layers thereof.

5. The semiconductor device of claim 1, wherein:

said first dielectric is selected from the group consisting of silicon oxide, silicon nitride, diamond or fluorine doped silicon or combinations and layers thereof; and said second dielectric is selected from the group consisting of spin on glass, porous silicon oxide, polyimide, polyimide siloxane, polysilsequioxane polymer, benzocyclobutene, paralyene N, paralyene F, polyolefin, poly-naphthalene, amorphous Teflon, SILK™, black diamond, polymer foam or aerogel and layers thereof.

6. The semiconductor device of claim 1, wherein said fill shapes and vias comprise tungsten, aluminum, aluminum-copper, aluminum-copper-silicon, copper tantalum, tantalum nitride, titanium, titanium nitride, a titanium-tungsten alloy or layers thereof.

7. The semiconductor device of claim 1, wherein said first and second fill shapes and said conductive via are electrically isolated.

8. The semiconductor device of claim 1, further including a third dielectric between said first and said second dielectrics, said conductive via formed in said third dielectric and at least a portion of said third dielectric extending between said first conductive fill shape and said second conductive fill shape.

9. A semiconductor device comprising:

a first wiring level having a first conductive fill shape, said first fill shape having corners, said first fill shape embedded in a first dielectric;

a second wiring level having a second conductive fill shape, said second fill shape having corners, said second fill shape embedded in a second dielectric, said second fill shape co-aligned with said first fill shape; and at least two conductive vias each conductive via aligned with a different corner of said first fill shape and corresponding corners of said second fill shape and extending between and joining said first and second fill shapes.

10. The semiconductor device of claim 9, further including a third dielectric between said first and said second dielectrics, said two or more conductive via formed in said third dielectric and at least a portion of said third dielectric extending between said first conductive fill shape and said second conductive fill shape.

* * * * *